United States Patent
Raj et al.

(10) Patent No.: US 12,183,393 B2
(45) Date of Patent: Dec. 31, 2024

(54) HIGH-SPEED MULTI-PORT MEMORY SUPPORTING COLLISION

(71) Applicant: QUALCOMM Incorporated, San Diego, CA (US)

(72) Inventors: Pradeep Raj, Bangalore (IN); Rahul Sahu, Bangalore (IN); Sharad Kumar Gupta, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/603,118

(22) Filed: Mar. 12, 2024

(65) Prior Publication Data

US 2024/0221828 A1 Jul. 4, 2024

Related U.S. Application Data

(62) Division of application No. 17/210,230, filed on Mar. 23, 2021, now Pat. No. 11,955,169.

(51) Int. Cl.
*G11C 11/418* (2006.01)
*G11C 11/419* (2006.01)

(52) U.S. Cl.
CPC .......... *G11C 11/418* (2013.01); *G11C 11/419* (2013.01)

(58) Field of Classification Search
CPC ............................ G11C 11/418; G11C 11/419
USPC ........................................................ 365/154
See application file for complete search history.

(56) References Cited

U.S. PATENT DOCUMENTS

| 5,062,081 | A | 10/1991 | Runaldue |
| 5,815,432 | A | 9/1998 | Naffziger et al. |
| 6,347,062 | B2 | 2/2002 | Nii et al. |
| 6,697,371 | B1 * | 2/2004 | Liang .................... H04L 49/351 370/389 |
| 7,898,894 | B2 | 3/2011 | Chang et al. |
| 9,455,026 | B2 | 9/2016 | Mojumder et al. |
| 9,524,972 | B2 | 12/2016 | Mojumder et al. |
| 9,536,596 | B2 | 1/2017 | Mojumder et al. |
| 9,928,889 | B1 * | 3/2018 | Narasimhan ......... G11C 7/1075 |
| 10,333,752 | B2 | 6/2019 | Jiang et al. |
| 10,650,906 | B2 | 5/2020 | Barth, Jr. et al. |
| 2002/0125585 | A1 * | 9/2002 | Slamowitz ............ G11C 11/413 365/189.16 |
| 2005/0063211 | A1 | 3/2005 | Atallah et al. |
| 2009/0231937 | A1 * | 9/2009 | Jung .................... G11C 7/1072 365/194 |
| 2013/0077416 | A1 | 3/2013 | Hold |

(Continued)

OTHER PUBLICATIONS

International Preliminary Report On Patentability—PCT/US2022/019591—The International Bureau of WIPO—Geneva, Switzerland—Oct. 5, 2023.

(Continued)

*Primary Examiner* — Sung Il Cho
(74) *Attorney, Agent, or Firm* — QUALCOMM Incorporated

(57) ABSTRACT

A multi-port memory is provided that supports collision between a read port and a write port to the same multi-port bitcell. A sense amplifier reads a data bit from a multi-port bitcell when a write port to the multi-port bitcell is addressed during a system clock signal. Should a read port to the multi-port bitcell be addressed during the same system clock signal, a multiplexer selects for an output bit from the sense amplifier.

9 Claims, 5 Drawing Sheets

(56) References Cited

U.S. PATENT DOCUMENTS

| 2014/0119102 | A1* | 5/2014 | Shankar | G11C 8/16 |
| | | | | 365/154 |
| 2017/0270988 | A1 | 9/2017 | Ikegami et al. | |
| 2021/0110853 | A1 | 4/2021 | Gupta et al. | |
| 2021/0304816 | A1 | 9/2021 | Gupta et al. | |
| 2022/0310156 | A1 | 9/2022 | Raj et al. | |

OTHER PUBLICATIONS

International Search Report and Written Opinion—PCT/US2022/019591—ISA/EPO—Jun. 13, 2022.

\* cited by examiner comparing a first read port address to a write port address to detect a first collision responsive to the first read port address matching the write port address and to detect a lack of a first collision responsive to the first read port address not matching the write port address ~ 400 at a first multiplexer, selecting for a data output bit resulting from a single-ended read through a first read port to a multi-port bitcell responsive to a detection of the lack of the first collision ~ 405 at the first multiplexer, selecting for a data output bit resulting from a differential read through a write port to the multi-port bitcell responsive to a detection of the first collision ~ 410

FIG. 4

HIGH-SPEED MULTI-PORT MEMORY SUPPORTING COLLISION

CROSS-REFERENCE TO RELATED APPLICATIONS

This application is a divisional of U.S. patent application Ser. No. 17/210,230 filed Mar. 23, 2021 and titled "High-Speed Multi-Port Memory Supporting Collision" the contents of which are incorporated by reference in their entirely.

TECHNICAL FIELD

This application relates to memories, and more particularly to a high-speed multi-port memory supporting collision.

BACKGROUND

A static random-access memory (SRAM) bitcell includes a pair of cross-coupled inverters for storing a bit. Each inverter requires two transistors so four transistors are required for the implementation of the two cross-coupled inverters. In a traditional single-port SRAM bitcell, two additional access transistors complete the bitcell implementation such that six transistors in total are required. The two access transistors are controlled by a shared word line so that the two access transistors form a single read/write port to the bitcell. But a single-port architecture may be problematic for multiple processor applications due to a resulting contention between the multiple processors at the single access port. By adding additional access transistors, a multi-port SRAM bitcell may have an access (read) port for each processor.

Although multi-port SRAMs are advantageous for multiple processor architectures, a collision occurs should a write operation be simultaneous with a read operation at the same multi-port SRAM bitcell. To avoid collisions, it is conventional for a multi-port SRAM bitcell to be accessed in a "double-pump" fashion with respect to a system clock signal that controls the memory access. In response to a transition (e.g., a rising edge) of the system clock signal, a read operation may occur to one or more of the access ports during a first portion of a period for the system clock signal. Following the completion of the read operation, a write operation may then occur in a second portion of the system clock signal period. But double-pump operation slows memory speed since the write and read operations must occur sequentially during a system clock signal period.

SUMMARY

In accordance with an aspect of the disclosure, a multi-port memory is provided that includes: a multi-port bitcell including a first read port having a first read port bit line, the multi-port bitcell further including a pair of write port bit lines; a sense amplifier coupled to the pair of write port bit lines; a first inverter coupled to the first read port bit line; and a first multiplexer configured to select between a data output bit from the sense amplifier and a data output bit from the first inverter to provide a selected data output bit.

In accordance with another aspect of the disclosure, a method of operation for a multi-port memory is provided that includes: comparing a first read port address to a write port address to detect a first collision responsive to the first read port address matching the write port address and to detect a lack of a first collision responsive to the first read port address not matching the write port address; at a first multiplexer, selecting for a data output bit resulting from a single-ended read through a first read port to a multi-port bitcell responsive to a detection of the lack of the first collision; and at the first multiplexer, selecting for a data output bit resulting from a differential read through a write port to the multi-port bitcell responsive to a detection of the first collision.

In accordance with yet another aspect of the disclosure, a multi-port memory is provided that includes: a multi-port bitcell including a first read port having a first read port bit line and a first read port word line, the multi-port bitcell further including a write port having a pair of write bit lines; an address comparator configured to detect a collision responsive to a write port address being directed to the write port and a read port address being directed to the first read port; and a read port word line controller configured to assert the first read port word line responsive to a lack of a detection of the collision and configured to not assert the first read port word line responsive to a detection of the collision.

In accordance with yet another aspect of the disclosure, a multi-port memory is provided that includes: an address comparator configured to detect a collision responsive to a read port address and a write port address both being directed to a first multi-port bitcell; a sense amplifier configured to read a first data bit from the first multi-port bitcell through a write port; a write driver configured to write a second data bit to the first multi-port bitcell through the write port after a completion of the read of the first data bit; and a multiplexer coupled to the sense amplifier, the multiplexer configured to select for the first data bit responsive to a detection of the collision.

These and additional advantages may be better appreciated through the following detailed description.

BRIEF DESCRIPTION OF THE DRAWINGS

FIG. 4 is a flowchart of a method of operation for collision support in accordance with an aspect of the disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

A multi-port SRAM is disclosed that supports collision rather than avoiding collision such as through a double-pumped operation. To support collision, the memory includes an address comparator for each read port. Each address comparator compares a read port address with a write port address. If the comparison indicates that the read port address is directed to a first multi-port bitcell whereas the write port address is directed to a second multi-port bitcell, then a single-ended read operation occurs through the read port to the first multi-port bitcell. At the same time, the write operation occurs through a write port to the second multi-port bitcell. High-speed operation is thus enhanced due to the simultaneous action of the read and write ports (albeit in different multi-port bitcells).

However, should the address comparison indicate that the read port address and the write port address are directed to the same multi-port bitcell, the read port is not accessed. To perform the read, the multi-port SRAM exploits the speed differences between a single-ended read operation and a differential read operation. To do so, the write operation is delayed until a differential read occurs through the write port. This differential read operation may thus occur each time a write port is accessed. Although the write operation is delayed so that that differential read may occur first, the memory operating speed is not affected since the single-ended read through the read port is not as fast as the differential read. The differential read and the write operation (which is also differential) may thus be completed in approximately the same amount of time that a single-ended read operation requires. Note the advantages: should a multi-port bitcell not have a collision, the single-ended read operation may proceed. On the other hand, a differential read occurs for multi-port bitcells with a collision. There is thus no delay as would occur in a double-pumped approach.

Figure 1:
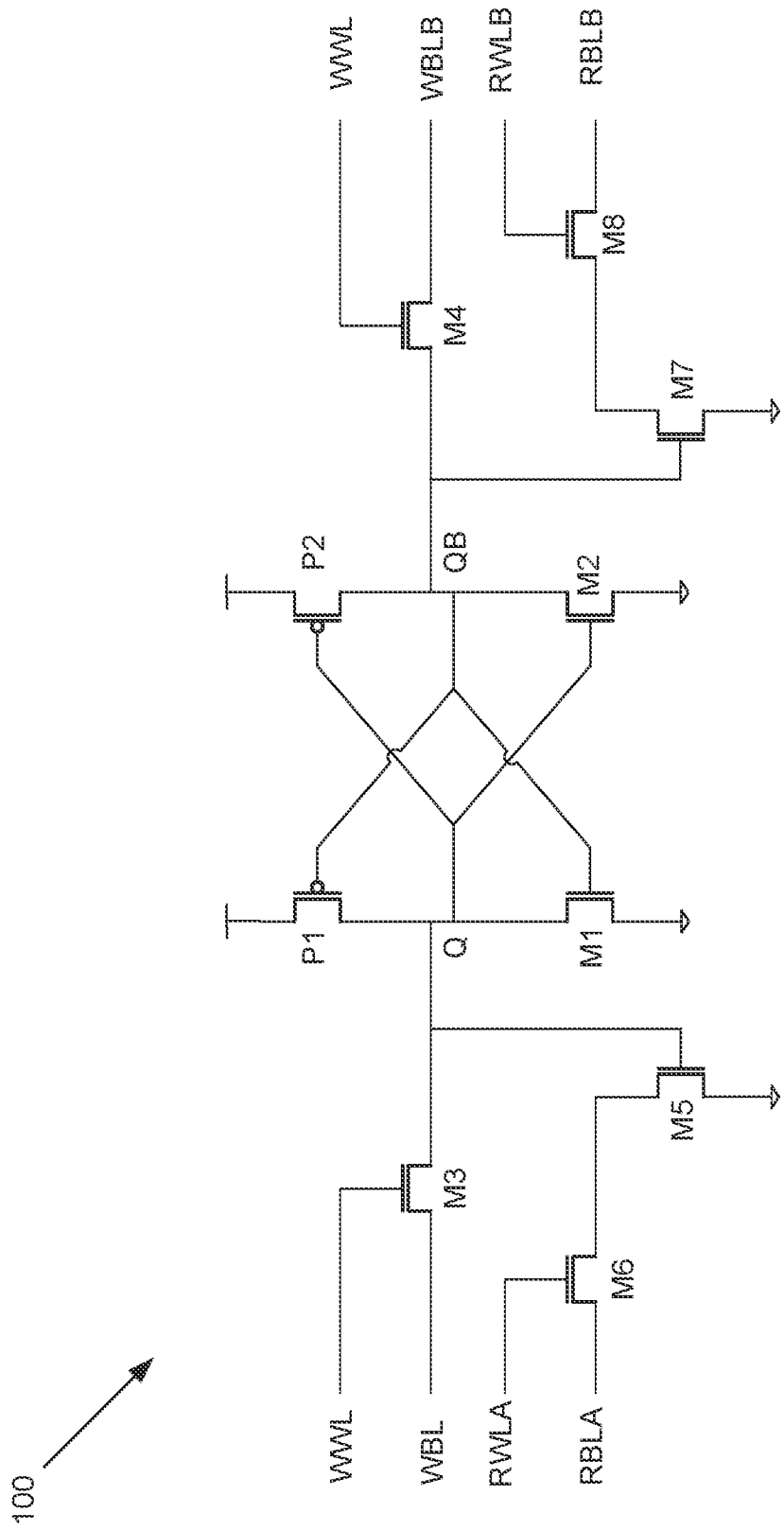
FIG. 1 illustrates an example multi-port bitcell for a multi-port memory practicing the collision support disclosed herein.

An example multi-port bitcell will now be discussed but it will be appreciated that an SRAM with any suitable multi-port bitcell architecture may practice the collision support disclosed herein. Moreover, the following example multi-port bitcell has a pair of read ports but just one read port may be included in the multi-port bitcell in alternative implementations. A multi-port SRAM bitcell thus includes at least one read port in addition to a write port. The write port and the read ports may be better appreciated with a consideration of an example three-port SRAM bitcell 100 shown in FIG. 1. The write port includes a write port access n-type metal-oxide-semiconductor (NMOS) transistor M3 and another write port access NMOS transistor M4. A write word line (WWL) connects to the gates of write port access transistors M3 and M4 so that the write port access transistors switch on when the write word line is charged to a power supply voltage. The write port also includes a pair of write bit lines formed by a true write bit line (WBL) and a complement write bit line (WBLB). For brevity, the true write bit line may also be denoted simply as the write bit line in the following discussion. The write bit line WBL connects to a drain/source terminal of the write port access transistor M3. A remaining drain/source terminal of the write port access transistor M3 connects to a Q data output node of the bitcell 100. The terminals are referred to as "drain/source" terminals in that which terminal is the source and which one is the drain depends upon the binary state of the SRAM bitcell 100 prior to a write operation and also depends upon a binary state of the bit being written into the SRAM bitcell 100 during the write operation. The complement write bit line WBLB is arranged analogously as it connects to a drain/source terminal of the write port access transistor M4. A remaining drain/source terminal of the write port access transistor M4 connects to a complement data output node QB of the SRAM bitcell 100.

Prior to a write operation, the write bit lines WBL and WBLB are pre-charged to a power supply voltage. The write operation occurs responsive to an edge (e.g., a rising edge) of a system clock signal. A word line generator or controller (not illustrated in FIG. 1 but discussed further below) responds to the clock edge by charging the write word line WWL to the power supply voltage so that write port access transistors are switched on. With the write word line asserted, a write driver (also not illustrated in FIG. 1 but discussed further below) may then drive the write bit line pair with a data bit to be written to the multi-port bitcell. Should the binary value of the data bit be true, the write driver discharges the complement write bit line WBLB while keeping the true write bit line WBL charged. Conversely, the write driver discharges the true write bit WBL line while keeping the complement write bit line WBLB charged in response to the data bit being false.

Depending upon which write bit line is charged versus which one of is discharged to ground by the write driver will determine which output node of the SRAM bitcell 100 is either charged to the power supply voltage or discharged to ground. For example, if the write bit line remains charged during the write operation, the Q output node is charged whereas the complement QB output node is discharged. The Q output node is also the output node of a first inverter that is cross-coupled with a second inverter in SRAM bitcell 100. The first inverter includes a p-type metal-oxide-semiconductor (PMOS) transistor P1 having a source connected to a power supply node for a power supply voltage. A drain of the transistor P1 connects to a drain of an NMOS transistor M1. A source of transistor M1 connects to ground. The drains of transistors P1 and M1 form the output node of the first inverter and also form the Q output node for bitcell 100.

The second inverter is arranged analogously and thus includes a PMOS transistor P2 having a source connected to the power supply node and a drain connected to a drain of an NMOS transistor M2 having a source connected to ground. The drains of transistors P2 and M2 form an output node for the second inverter and also form the QB output node. To complete the cross-coupling between the inverters, the Q output node connects to the gates of transistors P2 and M2. Similarly, the QB output node connects to the gates of transistors P1 and M2. The two inverters thus reinforce each other and latch the bit being written into the SRAM bitcell 100.

A first read port A for SRAM bitcell 100 includes an NMOS transistor M5, an NMOS access transistor M6, a read port A bit line A (RBLA), and a read port A word (RWLA). The read port A bit line RBLA connects to a drain of access transistor M6. A source of access transistor M6 connects to a drain of transistor M5. A source of transistor M5 connects to ground. The Q output node connects to a gate of transistor M5. The read port A word line RWLA connects to a gate of access transistor M6. Prior to a read operation to read port A, the read port A bit line RBLA is pre-charged to the power supply voltage. The read port A bit line RBLA then floats during a single-ended read operation to read port A so that the bit line voltage may be affected by the single-ended read operation through read port A to SRAM bitcell 100. During the single-ended read operation to read port A, the read port A word line RWLA is charged to the power supply voltage to switch on access transistor M6. Should the Q output node have been charged to the power supply voltage prior to a read operation on port A, transistor M5 will be switched on to discharge the source of transistor M6. With access transistor M6 being switched on from the assertion of the read port A word line RWLA, the read port A bit line RBLA will then discharge through transistors M5 and M6. Since the read operation to read port A is single-ended (it only involving one read bit line), a sense amplifier to sense the binary content of the SRAM bitcell 100 through read port A may be formed by a simple inverter (not shown in FIG. 1 but discussed further below). As the read port A bit line RBLA discharges to the trip point of the sense amplifier inverter, the sense amplifier inverter will assert its output signal to the power supply voltage to successfully represent the binary one that was being read from SRAM bitcell 100. Since the sense amplifier inverters disclosed herein are each formed by an inverter functioning as a sense amplifier, a sense amplifier inverter may also be denoted herein simply as an inverter.

Should SRAM bitcell 100 instead be storing a binary zero, the Q output node will be discharged prior to the read operation. In that case, transistor M5 will be switched off such that the read port A bit line RBLA retains its pre-charged state during the read operation to read port A. The sense amplifier inverter will thus continue to discharge its output signal to represent the binary zero being read from SRAM bitcell 100.

A remaining read port B is constructed analogously to include NMOS transistors M7 and M8 as well as a read port B word line (RWLB) and a read port B bit line (RBLB). The read port B bit line RBLB connects to a drain of access transistor M8. A source of access transistor M8 connects to a drain of transistor M7. A source of transistor M7 connects to ground. The QB output node connects to a gate of transistor M7. The read port B word line RWLB connects to a gate of access transistor M8. Prior to a single-ended read operation to read port B, the read port B bit line RBLB is pre-charged to the power supply voltage. The read port B bit line RBLB then floats so that its voltage may be affected by the read operation through read port B to SRAM bitcell 100. During the single-ended read operation through read port B, the read port B word line RWLB is charged to the power supply voltage to switch on access transistor M8. Should the QB output node have been charged to the power supply voltage prior to a read operation on port B, transistor M7 will be switched on to discharge the source of access transistor M8. With access transistor M8 being switched on from the assertion of the read port B word line RWLB, the read port B bit line RBLB will then discharge through transistors M7 and M8. Conversely, the read port B bit line RBLB remains pre-charged during the read port B access if the QB node is discharged.

The single-ended read operations to read ports A and B are only performed in the absence of a collision. If the write operation through the write port to multi-port bitcell 100 occurs in the same system clock cycle as a read operation occurs to read port A and/or to read port B, a collision occurs. The read operation is trying to read a binary state of a bit that has been stored in SRAM bitcell 100 while the write operation is potentially changing this binary state. The resulting collision corrupts the read operation. As discussed previously, collision mitigation is conventionally performed through a double-pumped operation which separates the system clock period into two portions. In a first portion, the read operation to either (or both) of read ports A and B occurs. The write port is not accessed during this first portion. In a second portion of the system clock period, the write operation takes place. There can be no collision if double-pumped operation is properly performed since the write operation does not occur during the read operation. But this splitting of the system clock cycle in double-pumped operation slows memory operating speed.

To avoid the timing penalty of double-pumped operation, a multi-port memory is provided in which the system clock period is not divided up into separate portions for the read and write operations. Instead, an address comparison is performed for each active read port to determine if the SRAM bitcell's write port is also being addressed by a write operation. Should the address comparison indicate that no write operation is occurring to the addressed SRAM bitcell, a single-ended read operation occurs over the corresponding read port. This single-ended read operation occurs such as discussed with regard to SRAM bitcell 100. The corresponding read port bit line is thus pre-charged and then floats while the corresponding read word line is then charged so that the resulting voltage of the read port bit line may be sensed by the sense amplifier inverter to produce a read port data output bit or a complement read port data output bit depending upon whether it is read port A or B that is being addressed. But if the address comparison indicates that the SRAM bitcell's write port is also being accessed, then the read operation does not occur over the read port. Since the read port is not being used, the corresponding read port bit line is not floated nor is the corresponding read word line voltage asserted. Instead, the read operation occurs through the write port should the write port be accessed for a multi-port SRAM bitcell during the same system clock cycle in which one (or both) of the read ports is accessed.

The read operation through the write port exploits the differences between the read and write ports. In particular, note that a write operation to the write port is differential in that it involves a pair of write port bit lines whereas a read operation to either of read ports A and B is single-ended and occurs over just one read port bit line. Given the differential nature of the write port access, a differential read of the bit stored in the multi-port SRAM bitcell may occur relatively quickly through the write port as compared to the single-ended read on one of the read ports. In that regard, the threshold voltage for a sense amplifier inverter performing a single-ended read is approximately one-half of the power supply voltage. For example, suppose that that the power supply voltage is 0.8 V. The threshold voltage for a sense amplifier inverter to perform the singled-ended read through a read port may then be approximately 400 mV. The pre-charge read port bit line must then be discharged from 800 mV to the trigger point of 400 mV before the sense amplifier inverter can make its bit decision. But a differential read over the write port bit lines does not require such a relatively large voltage change before a differential sense amplifier coupled to the write port bit lines may make a bit decision.

Should the write port be addressed in a given system clock cycle, the driving of the write port bit lines with the data bit to be written during the write operation is delayed until a differential read operation may take place. Prior to the write port access, the write port bit lines may be pre-charged in a default state. During the differential read over the write port, one of the write port bit lines will begin to discharge from the default pre-charged state depending upon the binary value of the stored bit in the multi-port SRAM bitcell. A voltage difference then develops between the write port bit lines that is sensed by the differential sense amplifier. As compared to the threshold voltage of the sense amplifier inverter, a differential sense amplifier may make a bit decision when the voltage difference is just a fraction of the power supply voltage (e.g., 100 mV, or 80 mV or even less). The voltage difference across the write port bit lines to make a differential bit decision in a differential sense amplifier is relatively small as compared to the threshold voltage for a sense amplifier inverter making a single-ended bit decision. A sufficient voltage difference across the write port bit lines to perform a differential read thus occurs relatively quickly as compared to a single-ended read operation.

Given this relative quickness for the differential read, the differential read and the driving of the write bit lines to complete the write operation may still be performed in substantially the same amount of time as taken by a single-ended read operation. The resulting operation is thus relatively high-speed as compared to a double-pumped operation in that the write operation (with its initial differential read) may begin at the substantially the same time that the single-ended read operation would have been performed but for the address comparison indicating that the write port was also being addressed.

In general, it is will be more common that a read port is accessed for a multi-port SRAM bitcell without a collision. In such a case, a single-ended read occurs over the addressed read port. The write port is not accessed so the write bit lines stay in their default pre-charged state. But it may be the case that a read port and a write port are both addressed for a given multi-port SRAM bitcell in the same system clock cycle. In that case, a single-ended read does not occur over the addressed read port but instead it is the write port through which a differential read operation occurs prior to the initiation and completion of the write operation. The differential read operation senses both the stored data bit in the multi-port SRAM bitcell and also its complement. A multiplexer may thus select the bit decision from the sense amplifier inverter for the addressed read port should the write port not be addressed (no collision) or select the bit decision from the differential sense amplifier should the write port be addressed (collision present). A latch may then latch the bit decision selection from the multiplexer.

Figure 2:
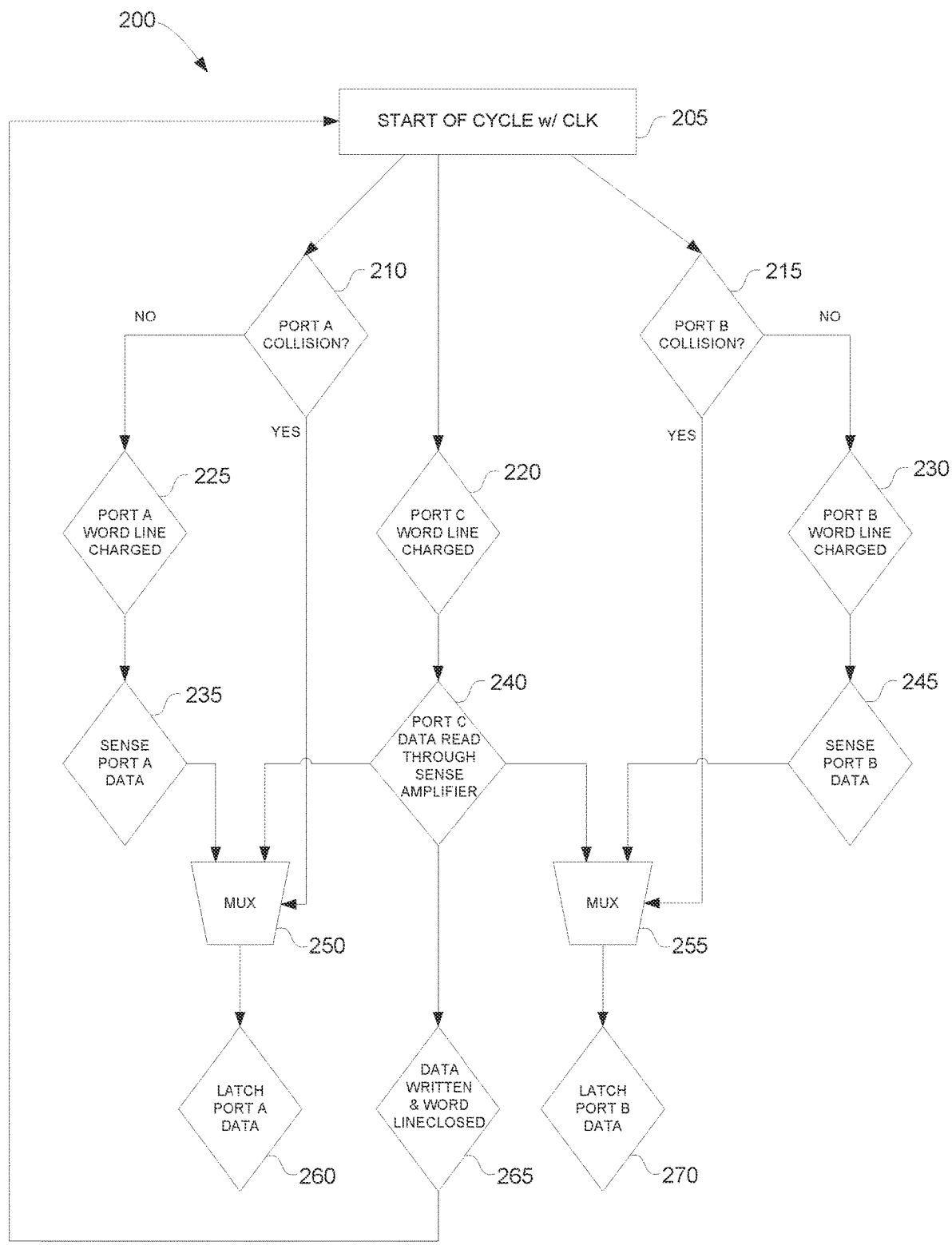
FIG. 2 is a flowchart for an example implementation of the collision support in accordance with an aspect of the disclosure.

A flowchart 200 for the resulting collision mitigation for a multi-port SRAM is shown in FIG. 2. With regard to this multi-port SRAM, multiple bitcell 100 is an example of a suitable multi-port bitcell but it will be appreciated that the collision mitigation disclosed herein may be practiced with any suitable multi-port bitcell architecture. Flowchart 200 begins responsive to a triggering edge of a clock signal 205 that starts a read and/or write operation. With regard to flowchart 200, the write port is denoted as port C to distinguish it from read ports A and B. Following the triggering edge of clock signal 205, it may be the case that the write port was being addressed although this is not necessarily true for every cycle of clock signal 205. Should the write port be addressed, the write word line (port C word line) is asserted in a step 220. Following the assertion of the write word line, a stored bit in the multi-port bitcell corresponding to write port C is retrieved via a differential read 240 through the pair of write bit lines to write port C. A differential sense amplifier then senses the binary value of the retrieved bit. With the differential read being completed, a write driver then proceeds to drive the data bit being written through write port C to the corresponding bitcell in a step 265. With the write operation complete, the write word line may be discharged (closed) to complete step 265.

To determine whether a collision to read port A has occurred in the same clock cycle, the read port A and the write port C addresses are compared in a step 210. Should the addresses point to the same multi-port bitcell (for example, the addresses may be equal), a collision has occurred which is denoted as a yes decision in flowchart 200. Conversely, no collision occurs with respect to read port A (denoted as a no decision in flowchart 200) should the read port A and write port C addresses be directed to different multi-port bitcells. Should there be no collision at read port A, the read port A word line may be charged in a step 225 so that a single-ended read operation may take place through read port A in a step 235. A multiplexer 250 may (assuming there is no collision) then select for the single-ended read result so that the output bit may be latched in a step 260. But if there was a collision between ports A and C, the read port A word line is not asserted and multiplexer 250 selects for the output bit that results from the differential read operation in step 240. The selection by multiplexer 250 may thus be controlled by whether the yes decision on a collision between ports A and C in step 210 is true or false.

A similar address comparison occurs for read port B in a step 215. Should the port B and port C addresses be directed to the same multi-port bitcell, a collision has occurred (a yes decision). Conversely, no collision occurs with respect to read port B (a no decision) should the read port B and write port C addresses be directed to different multi-port bitcells. Should there be no collision at read port B, the read port B word line may be charged in a step 230 so that a single-ended read operation may take place through read port B in a step 245. A multiplexer 255 may (assuming there is no collision) then select for the port B single-ended read result so that the complement output bit may be latched in a step 270. But if there was a collision between ports B and C, the read port B word line is not asserted and multiplexer 255 selects for the complement output bit that results from the differential read operation in step 240. The selection by multiplexer 255 may thus be controlled by whether the yes decision on collision between ports B and C in step 215 is true or false.

Figure 3:
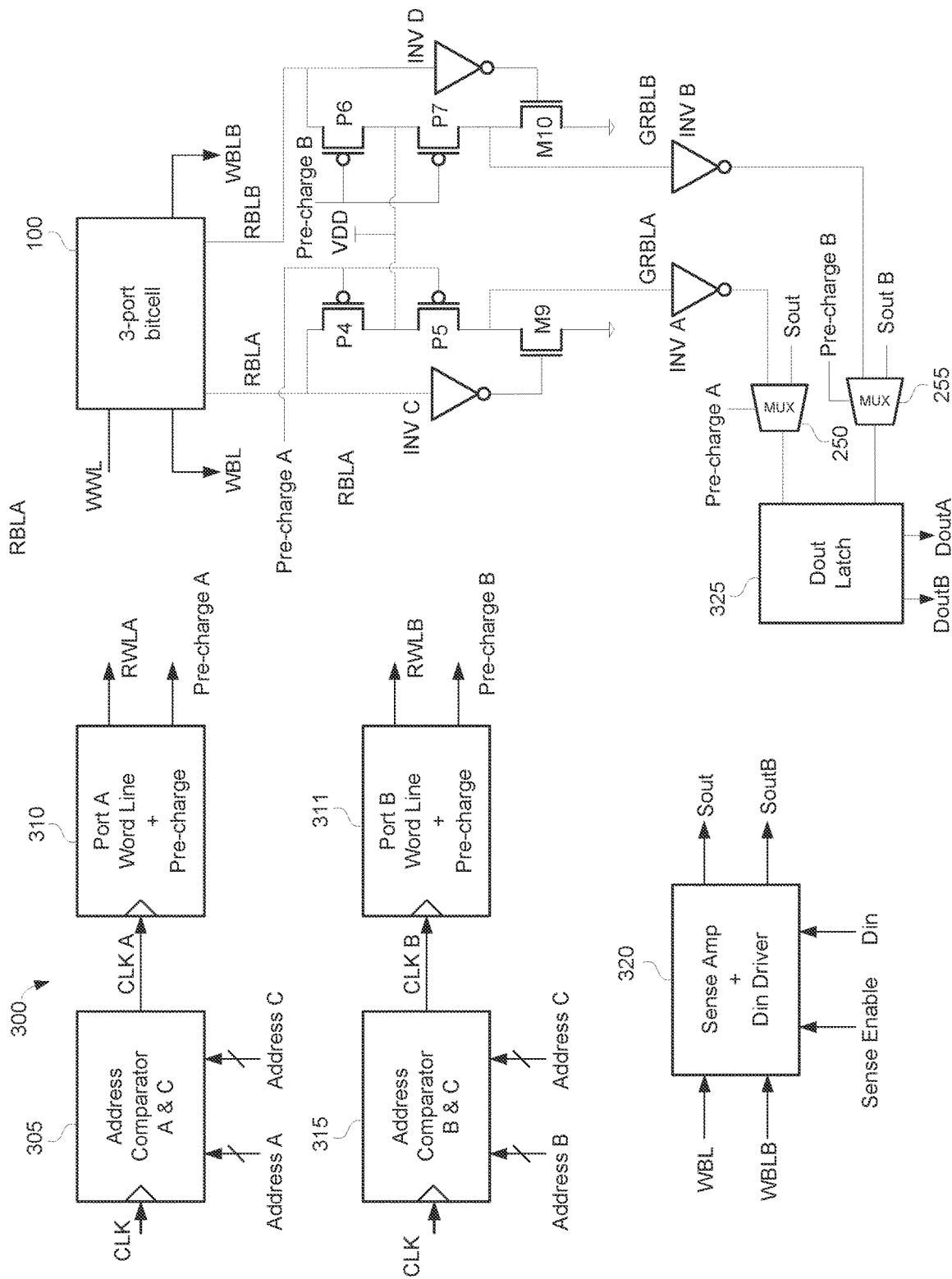
FIG. 3 is a circuit diagram of a multi-port memory configured to provide collision support in accordance with an aspect of the disclosure.

An SRAM 300 configured for collision avoidance with now be discussed with regard to FIG. 3. An address comparator 305 performs the address comparison between the port A and port C addresses responsive to a triggering edge of a system clock signal (CLK). Should the comparison indicate that there is no collision between ports A and C, address comparator 305 passes the system clock signal as a clock A signal (CLKA) to a pre-charge and port A word line controller 310 to trigger the assertion (charging) of the port A word line and also the floating of the pre-charge of the port A bit line responsive to an assertion of a pre-charge A signal. The state of the pre-charge signal A (true or false) may control the selection by multiplexer 250 as will be explained further herein.

An address comparator 315 performs the address comparison between the port B and port C addresses responsive to a triggering edge of the system clock signal (CLK). Should the comparison indicate that there is no collision between ports B and C, address comparator 315 passes the system clock signal as a clock B signal (CLKB) to a pre-charge and port B word line controller 311 to trigger the assertion (charging) of the port B word line and also the floating of the pre-charge of the port B bit line responsive to an assertion of a pre-charge B signal. The state of the pre-charge signal B (true or false) may control the selection by multiplexer 255 as will be explained further herein.

The write port in multi-port bitcell 100 includes the write word line WWL and the write bit lines WBL and WBLB as discussed previously. A differential sense amplifier 320 couples to the write bit lines WBL and WBLB so that when the write word line WWL is asserted to open up the write port, differential sense amplifier 320 may sense both the data bit stored in multi-port bitcell 100 and also its complement. The sensed data bit is represented as Sout whereas the complement sensed data bit is represented as SoutB. The sensing by sense amplifier 320 is responsive to an assertion of a sense enable signal. Sense amplifier 320 is also integrated with a write driver (Din driver) that may then drive the write bit lines WBL and WBLB with the data bit Din to be written after the differential read operation is completed.

The pre-charge A signal drives the gate of a PMOS transistor P4 having a source tied to a power supply voltage node and a drain connected to the read port A bit line. The pre-charge A signal controls whether the read port A bit line floats or remains in its default pre-charged state. When the pre-charge A signal is de-asserted, the pre-charging of the read port A bit line occurs due to the conduction by transistor P4. As used herein, a signal is deemed to be "asserted" when that signal is true regardless of whether a logic high or a logic low convention is used. The pre-charge A signal is active-high so it is asserted by being charged to the power supply voltage. The pre-charge A signal also controls the floating of a global read port A bit line (GRBLA). To do so, the pre-charge A signal also drives a gate of a PMOS transistor P5 having its drain connected to the global read port A bit line and its source connected to the power supply node. The de-assertion of the pre-charge A signal thus also forces transistor P5 to conduct to pre-charge the global read bit line A to the power supply voltage. An inverter INV C inverts the binary state of the read port A bit line to drive a gate of an NMOS transistor M9 having its source connected to ground and a drain connected to the global read port A bit line. Transistor M9 is thus off while the read port A bit line is pre-charged. If the read port A is addressed, the pre-charge A signal will be asserted to switch off both transistor P4 and P5 so that the read port A bit line RBLA and the global read port A bit line GRBLA both float. If the data bit stored in the multi-port bitcell 100 is a binary zero (assuming a logic-high convention), the pre-charged state of the RBLA and GRBLA lines will be unaffected despite their floating. A read port A sense amplifier inverter (INV A) inverts the binary state of the GRBLA line to provide a sensed data output bit that is selected for by multiplexer 250 due to the assertion of the pre-charge A signal. But in a collision, the pre-charge A signal is not asserted so that multiplexer 250 selects for the Sout data bit from differential sense amplifier 320. A data output latch 325 may then latch a sensed bit (DoutA), regardless of whether it was produced by read port A or write port C.

The read port B is analogous. The pre-charge B signal drives the gate of a PMOS transistor P6 having a source tied to a power supply voltage node and a drain connected to the read port B bit line B (RBLB). The pre-charge B signal controls whether the read port B bit line floats or remains in its default pre-charged state. When the pre-charge B signal is de-asserted, the pre-charging of the read port B bit line occurs due to the conduction by transistor P6. The pre-charge B signal also controls the floating of a global read port B bit line (GRBLB). To do so, the pre-charge B signal also drives a gate of a PMOS transistor P7 having its drain connected to the global read port B bit line and its source connected to the power supply node. The de-assertion of the pre-charge B signal thus also forces transistor P7 to conduct to pre-charge the global read port B bit line to the power supply voltage. An inverter INV D inverts the binary state of the read port B bit line to drive a gate of an NMOS transistor M10 having its source connected to ground and a drain connected to the global read port B bit line. Transistor M10 is thus off while the read port B bit line is pre-charged. If the read port B is addressed, the pre-charge B signal will be asserted to switch off both transistor P6 and P7 so that the read port B bit line RBLB and the global read port B bit line GRBLB both float. If the data bit stored in the multi-port bitcell 100 is a binary zero (again assuming a logic-high convention), the pre-charged state of the RBLB and GRBLB lines will be unaffected despite their floating. A read port B sense amplifier inverter (INV B) inverts the binary state of the GRBLB line to provide a sensed data output bit that is selected for by multiplexer 255 due to the assertion of the pre-charge B signal. But in a collision, the pre-charge B signal is not asserted so that multiplexer 255 instead selects for the SoutB complement data bit from differential sense amplifier 320. Data output latch 325 may then latch a sensed bit (DoutB), regardless of whether it was produced by read port B or write port C.

A method of collision support will now be discussed with reference to the flowchart of FIG. 4. The method includes an act 400 of comparing a first read port address to a write port address to detect a first collision responsive to the first read port address matching the write port address and to detect a lack of a first collision responsive to the first read port address not matching the write port address. The comparison in either of address comparators 305 and 315 is an example of act 400. The method further includes an act 405 that occurs a first multiplexer and includes selecting for a data output bit resulting from a single-ended read through a first read port to a multi-port bitcell responsive to a detection of the lack of the first collision. The selection at either of multiplexers 250 or 255 with no collision is an example of act 405. Finally, the method includes an act 410 that also occurs at the first multiplexer and includes selecting for a data output bit resulting from a differential read through a write port to the multi-port bitcell responsive to a detection of the first collision. The selection at either of multiplexer 250 or 255 with collision is an example of act 410.

Figure 5:
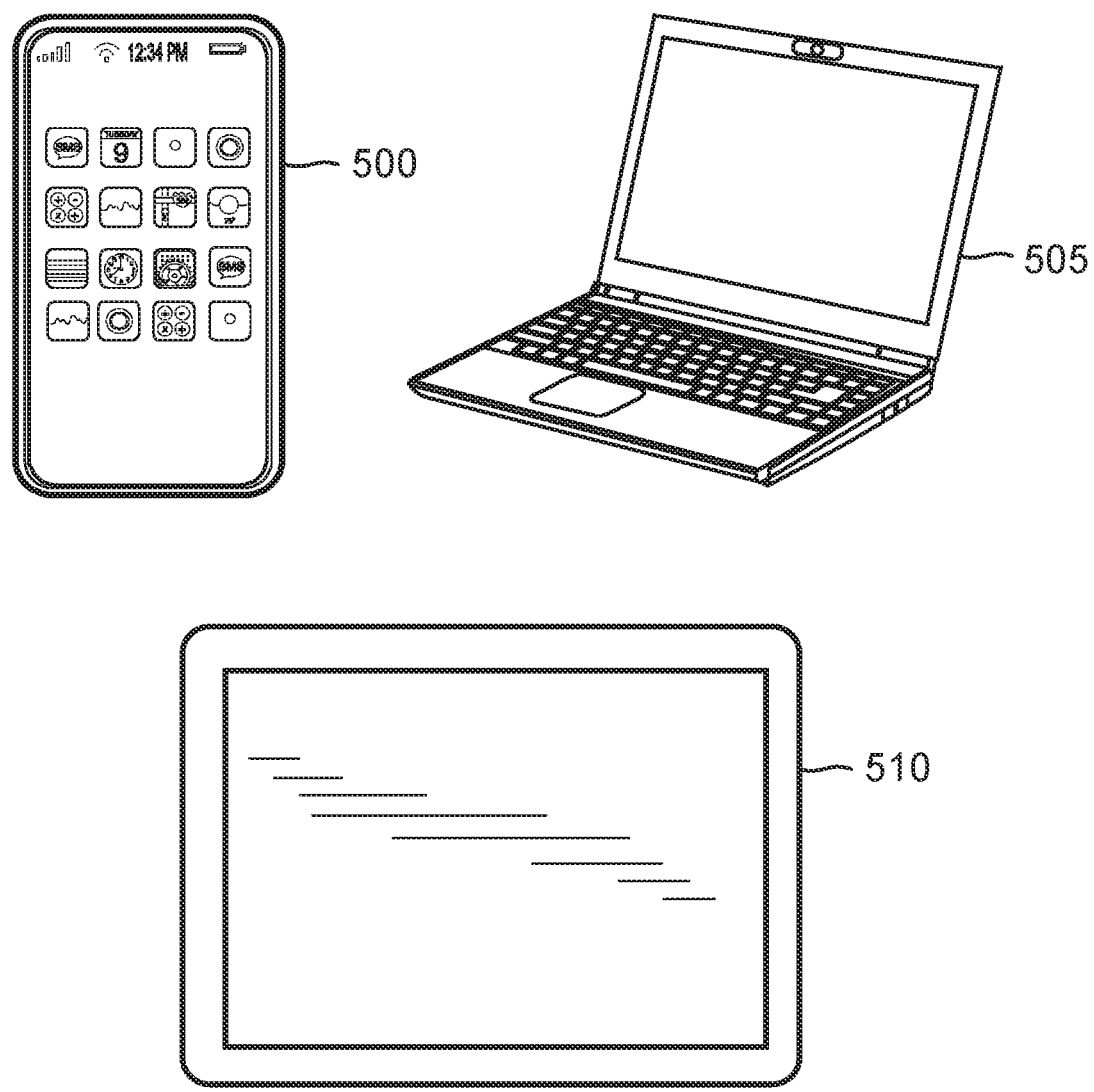
FIG. 5 illustrates some example electronic systems each incorporating a multi-port memory with collision support in accordance with an aspect of the disclosure.

A multi-port memory with collision support as disclosed herein may be incorporated into a wide variety of electronic systems. For example, as shown in FIG. 5, a cellular telephone 500, a laptop computer 505, and a tablet PC 510 may all include a multi-port memory with collision support in accordance with the disclosure. Other exemplary electronic systems such as a music player, a video player, a communication device, and a personal computer may also be configured with multi-port memories constructed in accordance with the disclosure.

The disclosure will now be summarized in the following series of clauses:

Clause 1. A multi-port memory, comprising:
    a multi-port bitcell including a first read port having a first read port bit line, the multi-port bitcell further including a pair of write port bit lines;
    a sense amplifier coupled to the pair of write port bit lines;
    a first inverter coupled to the first read port bit line; and
    a first multiplexer configured to select between a data output bit from the sense amplifier and a data output bit from the first inverter to provide a selected data output bit.

Clause 2. The multi-port memory of clause 1, wherein the multi-port bitcell further includes a second read port having a second read port bit line, the multi-port memory further comprising:
    a second inverter coupled to the second read port bit line; and
    a second multiplexer configured to select between a complement data output bit from the sense amplifier and a complement data output bit from the second inverter to provide a selected complement data output bit.

Clause 3. The multi-port memory of clause 2, further comprising:
    a data latch configured to latch the selected data output bit and the selected complement data output bit.

Clause 4. The multi-port memory of any of clauses 1-3, further comprising:
    an address comparator configured to detect a collision responsive to a read port address being the same as a write port address and to detect a lack of a collision responsive to the read port address being different from the write port address; and a read word line controller configured to assert a read port word line to the first read port responsive to a detection of the lack of the collision and to not assert the read port word line responsive a detection of the collision.

Clause 5. The multi-port memory of clause 4, wherein the read word line controller is further configured to assert a pre-charge signal responsive to the detection of the lack of the collision and to not assert the pre-charge signal responsive to the detection of the collision.

Clause 6. The multi-port memory of clause 5, further comprising a transistor coupled between the first read port bit line and a power supply node for a power supply voltage, wherein the transistor is configured to switch on responsive to an assertion of the pre-charge signal and to turn off responsive to a non-assertion of the pre-charge signal.

Clause 7. The multi-port memory of clause 6, wherein the transistor comprises a p-type metal-oxide-semiconductor (PMOS) transistor.

Clause 8. The multi-port memory of any of clauses claim 1-7, further comprising:

a write driver configured to drive the pair of write bit line responsive to a bit to be written to the multi-port bitcell after a completion of a sense operation by the sense amplifier.

Clause 9. The multi-port memory of clause 4, wherein the multi-port bitcell comprises a pair of cross-coupled inverters configured to drive a data output node and a complement data output node, and wherein the first read port further includes an access transistor configured to be controlled by the read port word line.

Clause 10. The multi-port memory of clause 9, wherein the first read port further includes a second transistor coupled between ground and a terminal of the access transistor, and wherein a gate of the second transistor is coupled to the data output node, and wherein the multi-port memory is integrated into a cellular telephone.

Clause 11. A method of operation for a multi-port memory, comprising:

comparing a first read port address to a write port address to detect a first collision responsive to the first read port address matching the write port address and to detect a lack of a first collision responsive to the first read port address not matching the write port address;

at a first multiplexer, selecting for a data output bit resulting from a single-ended read through a first read port to a multi-port bitcell responsive to a detection of the lack of the first collision; and at the first multiplexer, selecting for a data output bit resulting from a differential read through a write port to the multi-port bitcell responsive to a detection of the first collision.

Clause 12. The method of clause 11, further comprising:

triggering the comparing of the first read port address to the write port address responsive to an edge of a clock signal.

Clause 13. The method of any of clauses 11-12, further comprising:

comparing a second read port address to the write port address to detect a second collision responsive to the second read port address matching the write port address and to detect a lack of a second collision responsive to the second read port address not matching the write port address;

at a second multiplexer, selecting for a complement data output bit resulting from a single-ended read through a second read port to the multi-port bitcell responsive to a detection of the lack of the second collision; and at the second multiplexer, selecting for a complement data output bit resulting from the differential read through the write port to the multi-port bitcell responsive to a detection of the second collision.

Clause 14. The method of any of clauses claim 11-13, further comprising:

pre-charging a first bit line in the first read port prior to the comparing of the first read port address to the write port address; and floating the first bit line responsive to the detection of the first collision; and maintaining the pre-charging of the first bit line responsive to the detection of the lack of the first collision.

Clause 15. The method of clause 14, further comprising:

asserting a pre-charge signal responsive to the detection of the lack of the first collision, wherein the floating of the first bit line is responsive to an assertion of the pre-charge signal.

Clause 16. The method of clause 15, further comprising:

switching off a transistor coupled between the first bit line and a power supply node for a power supply voltage responsive to the assertion of the pre-charge signal.

Clause 17. The method of clause 16, further comprising:

maintaining a de-assertion of the pre-charge signal responsive to the detection of the first collision to maintain an on-state of the transistor.

Clause 18. The method of any of clauses claim 11-17, further comprising:

latching a data output bit from the first multiplexer.

Clause 19. A multi-port memory, comprising:

a multi-port bitcell including a first read port having a first read port bit line and a first read port word line, the multi-port bitcell further including a write port having a pair of write port bit lines;

an address comparator configured to detect a collision responsive to a write port address being directed to the write port and a read port address being directed to the first read port; and a read port word line controller configured to assert the first read port word line responsive to a lack of a detection of the collision and configured to not assert the first read port word line responsive to a detection of the collision.

Clause 20. The multi-port memory of clause 19, wherein the read port word line controller is further configured to assert a pre-charge signal for the first read port responsive to the lack of the detection of the collision, and wherein the first read port is further configured to float the first read port bit line responsive to an assertion of the pre-charge signal.

Clause 21. The multi-port memory of any of clauses 19-20, further comprising:

a sense amplifier configured to perform a differential read through the write port responsive to the write port address being directed to the write port.

Clause 22. The multi-port memory of clause 21, further comprising:

a data driver configured to drive the pair of write port bit lines with a data bit to be written to the multi-port bitcell after a completion of the differential read.

Clause 23. The multi-port memory of any of clauses 21-22, further comprising:

an inverter coupled to the first read port bit line; and a multiplexer configured to select between an output of the inverter and the sense amplifier.

Clause 24. A multi-port memory, comprising:
an address comparator configured to detect a collision responsive to a read port address and a write port address both being directed to a first multi-port bitcell;
a sense amplifier configured to read a first data bit from the first multi-port bitcell through a write port;
a write driver configured to write a second data bit to the first multi-port bitcell through the write port after a completion of the read of the first data bit; and
a multiplexer coupled to the sense amplifier, the multiplexer configured to select for the first data bit responsive to a detection of the collision.

Clause 25. The multi-port memory of clause 24, further comprising:
an inverter coupled to a read port bit line in a first read port in the first multi-port bitcell, wherein the multiplexer is further configured to select for an output of the inverter responsive to a detection of a lack of the collision.

Clause 26. The multi-port memory of clause 25, further comprising:
a data latch configured to latch an output bit from the multiplexer.

Clause 27. The multi-port memory of any of clauses claim 25-26, wherein the first multi-port bitcell includes a second read port.

Clause 28. The multi-port memory of any of clauses 25-27, further comprising:
a read port word line controller configured to assert a word line to the first read port responsive to the detection of the lack of the collision.

Clause 29. The multi-port memory of clause 28, wherein the read port word line controller is further configured to assert a pre-charge signal to the first read port responsive to the detection of the lack of the collision.

Clause 30. The multi-port memory of any of clauses 24-29, wherein the address comparator is configured to be triggered to detect the collision responsive to an edge of a clock signal.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A multi-port memory, comprising:
a multi-port bitcell including a first read port having a first read port bit line and a first read port word line, the multi-port bitcell further including a write port having a pair of write bit lines;
an address comparator configured to detect a collision responsive to a write port address being directed to the write port and a read port address being directed to the first read port;
a read port word line controller configured to assert the first read port word line responsive to a lack of a detection of the collision and configured to not assert the first read port word line responsive to a detection of the collision;
a sense amplifier configured to perform a differential read through the write port responsive to the write port address being directed to the write port;
an inverter coupled to the first read port bit line; and
a multiplexer configured to select between an output of the inverter and the sense amplifier.

2. The multi-port memory of claim 1, wherein the read port word line controller is further configured to assert a pre-charge signal for the first read port responsive to the lack of the detection of the collision, and wherein the first read port is further configured to float the first read port bit line responsive to an assertion of the pre-charge signal.

3. The multi-port memory of claim 1, further comprising:
a data driver configured to drive the pair of write port bit lines with a data bit to be written to the multi-port bitcell after a completion of the differential read.

4. A multi-port memory, comprising:
an address comparator configured to detect a collision responsive to a read port address and a write port address both being directed to a first multi-port bitcell;
a sense amplifier configured to read a first data bit from the first multi-port bitcell through a write port;
a write driver configured to write a second data bit to the first multi-port bitcell through the write port after a completion of the read of the first data bit;
a multiplexer coupled to the sense amplifier, the multiplexer configured to select for the first data bit responsive to a detection of the collision; and
an inverter coupled to a read port bit line in a first read port in the first multi-port bitcell, wherein the multiplexer is further configured to select for an output of the inverter responsive to a detection of a lack of the collision.

5. The multi-port memory of claim 4, further comprising:
a data latch configured to latch an output bit from the multiplexer.

6. The multi-port memory of claim 4, wherein the first multi-port bitcell includes a second read port.

7. The multi-port memory of claim 4, further comprising:
a read port word line controller configured to assert a word line to the first read port responsive to the detection of the lack of the collision.

8. The multi-port memory of claim 7, wherein the read port word line controller is further configured to assert a pre-charge signal to the first read port responsive to the detection of the lack of the collision.

9. The multi-port memory of claim 4, wherein the address comparator is configured to be triggered to detect the collision responsive to an edge of a clock signal.

* * * * *